United States Patent
Lee et al.

(10) Patent No.: US 7,898,007 B2
(45) Date of Patent: Mar. 1, 2011

(54) SEMICONDUCTOR DEVICES INCLUDING LINE PATTERNS SEPARATED BY CUTTING REGIONS

(75) Inventors: Sung-Bok Lee, Suwon-si (KR); Joon-Hee Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 517 days.

(21) Appl. No.: 11/961,551

(22) Filed: Dec. 20, 2007

(65) Prior Publication Data
US 2009/0072322 A1    Mar. 19, 2009

(30) Foreign Application Priority Data
Sep. 18, 2007   (KR) .................... 10-2007-0094822

(51) Int. Cl.
*H01L 23/52* (2006.01)
(52) U.S. Cl. .................. 257/211; 257/208; 257/207; 257/620; 257/E29.12
(58) Field of Classification Search .............. 257/208, 257/209, 211
See application file for complete search history.

(56) References Cited

U.S. PATENT DOCUMENTS

| | | | |
|---|---|---|---|
| 5,032,890 A * | 7/1991 | Ushiku et al. ............. 257/211 |
| 7,023,094 B2 | 4/2006 | Suga | |
| 7,226,855 B2 | 6/2007 | Suga | |
| 7,724,597 B2 * | 5/2010 | Lee ................. 365/210.1 |
| 2003/0107055 A1 * | 6/2003 | Watanabe et al. ......... 257/208 |
| 2004/0262640 A1 | 12/2004 | Suga | |
| 2006/0118966 A1 | 6/2006 | Suga | |
| 2006/0194429 A1 | 8/2006 | Hashimoto et al. | |

FOREIGN PATENT DOCUMENTS

| | | |
|---|---|---|
| JP | 2005-19604 A | 1/2005 |
| KR | 2003-0001883 A | 1/2003 |
| KR | 10-2006-0002180 A | 1/2006 |
| KR | 10-2006-0074876 A | 7/2006 |

* cited by examiner

*Primary Examiner*—Kenneth A Parker
*Assistant Examiner*—Jose R Diaz
(74) *Attorney, Agent, or Firm*—Myers Bigel Sibley & Sajovec, P.A.

(57) ABSTRACT

Semiconductor devices are provided. A semiconductor device can include a substrate and a plurality of dummy line patterns on the substrate that extend in a first direction parallel with one another. Each of the dummy line patterns can include a plurality of sub-line patterns aligned along the first direction and which are separated from each other by at least one cutting region therebetween. The dummy line patterns can include first and second dummy line patterns which are adjacent to each other in a second direction that is perpendicular to the first direction. At least one of the cutting regions between a pair of sub-line patterns of the first dummy line pattern is aligned with and bounded by one of the sub-line patterns of the second dummy line pattern in the second direction.

23 Claims, 12 Drawing Sheets

SEMICONDUCTOR DEVICES INCLUDING LINE PATTERNS SEPARATED BY CUTTING REGIONS

CROSS-REFERENCE TO RELATED APPLICATION

This U.S. non-provisional patent application claims priority under 35 U.S.C §119 of Korean Patent Application 10-2007-0094822 filed on Sep. 18, 2007, the entirety of which is hereby incorporated by reference.

BACKGROUND

The present invention relates to semiconductor devices and, more particularly, to semiconductor devices including line patterns.

Conductive line patterns of a semiconductor device may be used to transfer, supply, or output an electrical signal. The line patterns may be electrically connected to discrete circuit elements of the semiconductor device, and an electrical input signal may be supplied to the discrete circuit elements through the line patterns and/or electrical information generated from the discrete elements may be output through the line patterns. Further, the respective line patterns may electrically interconnect the discrete elements which are separated from each other, thereby enabling electrical communication between the discrete elements. Exemplary discrete circuit elements can include metal-oxide-semiconductor (MOS) transistors, capacitors, diodes, and/or resistors.

In some cases, the line patterns may be formed to have the same width and the same distance therebetween. In addition, the line patterns may be partially cut/delineated to provide certain design characteristics of the semiconductor device.

FIG. 1 is a plan view illustrating conventional line patterns of a semiconductor device.

Referring to FIG. 1, a plurality of line patterns 10 are formed on a substrate. The line patterns 10 may be formed so as to extend parallel with one another along a first direction. The line patterns 10 may also be formed to have the same distance therebetween (i.e., spaced apart by the same distance) in a second direction that is perpendicular to the first direction. The line patterns 10 may be subdivided along the first direction into separate portions 12 by cutting regions 15 extending in the second direction through the line patterns 10. Accordingly, the first direction may correspond to rows and the second direction may correspond to columns.

The separated portions 12 and the cutting regions 15 may be defined using a single photolithography process. For example, the separated portions 12 and the cutting regions 15 may be defined by coating a photoresist layer on a conductive layer deposited on a substrate, exposing the photoresist layer using a photo mask, and developing the exposed photoresist layer to form photoresist patterns. Subsequently, the conductive layer is etched using the photoresist patterns as etch masks. As a result, the line patterns 10 including the cutting regions 15 are formed on the substrate.

As shown in FIG. 1, the cutting regions 15 are aligned relative to each other along a straight line that crosses the line patterns 10. When exposing the cutting regions 15 to light during an exposure step of a photolithography process, interference in the light pattern may result along the adjacent cutting regions 15. As a result, some portions of photoresist patterns that are adjacent to the cutting regions 15 may be deformed so as to have undesirable shapes. For example, a notching phenomenon may occur on the separated portions 12 adjacent to the cutting regions 15 when a relatively high level of energy is used during the exposure step of the photolithography process. In such example, the widths of the photoresist patterns adjacent to the cutting regions 15 may be reduced and, correspondingly, may result in increased areas of the cutting regions 15. Alternatively, some residues of the photoresist layer may remain between the photoresist patterns when the exposure energy of the photolithography process is low. Bridges may thereby be formed that cause electrical shorts between adjacent line patterns 10.

SUMMARY OF THE INVENTION

In some embodiments of the present invention, a semiconductor device includes a substrate and a plurality of dummy line patterns thereon. The dummy line patterns extend in a first direction parallel with one another. Each of the dummy line patterns includes a plurality of sub-line patterns aligned along the first direction and which are separated from each other by at least one cutting region therebetween. The dummy line patterns include first and second dummy line patterns which are adjacent to each other in a second direction that is perpendicular to the first direction. One of the cutting regions between a pair of sub-line patterns of the first sub-line patterns is aligned with and bounded by one of the sub-line patterns of the second dummy line pattern in the second direction.

In some further embodiments, the semiconductor device may include at least one active line pattern that is adjacent in the second direction and parallel to the first dummy line pattern and one of the cutting regions between a pair of sub-line patterns of the first dummy line pattern is aligned with and bounded by the active line pattern. At least one active line pattern and the dummy line patterns may be sequentially spaced apart a same distance in the second direction.

In some further embodiments, at least one of the sub-line patterns and at least two of the cutting regions may be aligned in the second direction so that an imaginary straight line in the second direction extends therethrough. The at least two cutting regions through which the imaginary straight line passes may be adjacent to each other in the second direction. At least one of the sub-line patterns may be between and aligned in the second direction with the at least two cutting regions through which the imaginary straight line passes.

In some further embodiments, one of the cutting regions and at least one of the sub-line patterns may be aligned in the second direction so that an imaginary straight line in the second direction extends therethrough.

In some further embodiments, the semiconductor device may further include a contact plug connected to at least one of the sub-line patterns. A width of the contact plug along the second direction may be greater than a width of the sub-line pattern connected to the contact plug. The contact plug may be between the sub-line pattern connected to the contact plug and the substrate. The semiconductor device may further include an upper contact plug on the sub-line pattern which is connected to the contact plug. A width of the upper contact plug along the second direction may be less than the width of the contact plug.

In some further embodiments, a portion of the sub-line pattern connected to the contact plug may extend along the second direction to contact at least one of the other sub-line patterns adjacent thereto, thereby forming a landing pad between the adjacent sub-line patterns. The contact plug may be connected to the landing pad. The contact plug may be between the landing pad and the substrate. Alternatively, the contact plug may be on the landing pad opposite the substrate.

In some further embodiments, the semiconductor device may include a ground selection line, a plurality of word lines, and a string selection line on the substrate extending in the second direction. The substrate can have a first region and a second region. A first insulating layer is on the substrate including the ground selection line, the word lines, and the string selection line. A common source line is in the first insulating layer. The common source line contacts the substrate at one side of the ground selection line and extends along the second direction. A second insulating layer is on the substrate including the common source line and the first insulating layer. A plurality of bit lines are on the second insulating layer and extend along the first direction. A plurality of bit line plugs each extend through the first and second insulating layers to electrically connect respective one of the bit lines and the substrate on one side of the string selection line. The plurality of dummy line patterns are on the second insulating layer in the first region.

DETAILED DESCRIPTION OF PREFERRED EMBODIMENTS

Figure 1:
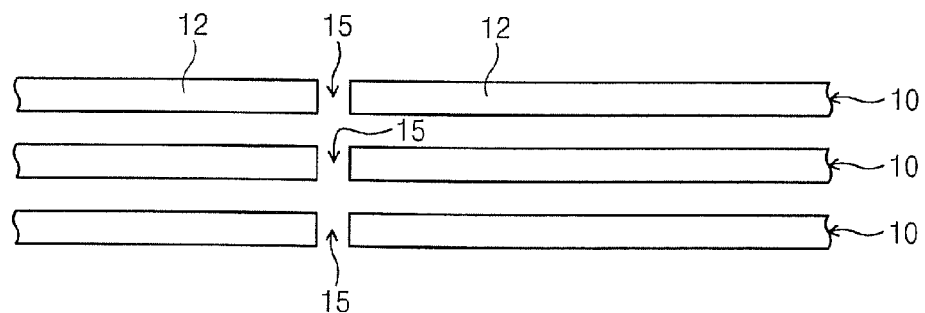
FIG. 1 is a plan view illustrating a conventional line pattern of a semiconductor device.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a film, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, film or region to another element, film or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of films and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

First Set of Embodiments

Figure 2:
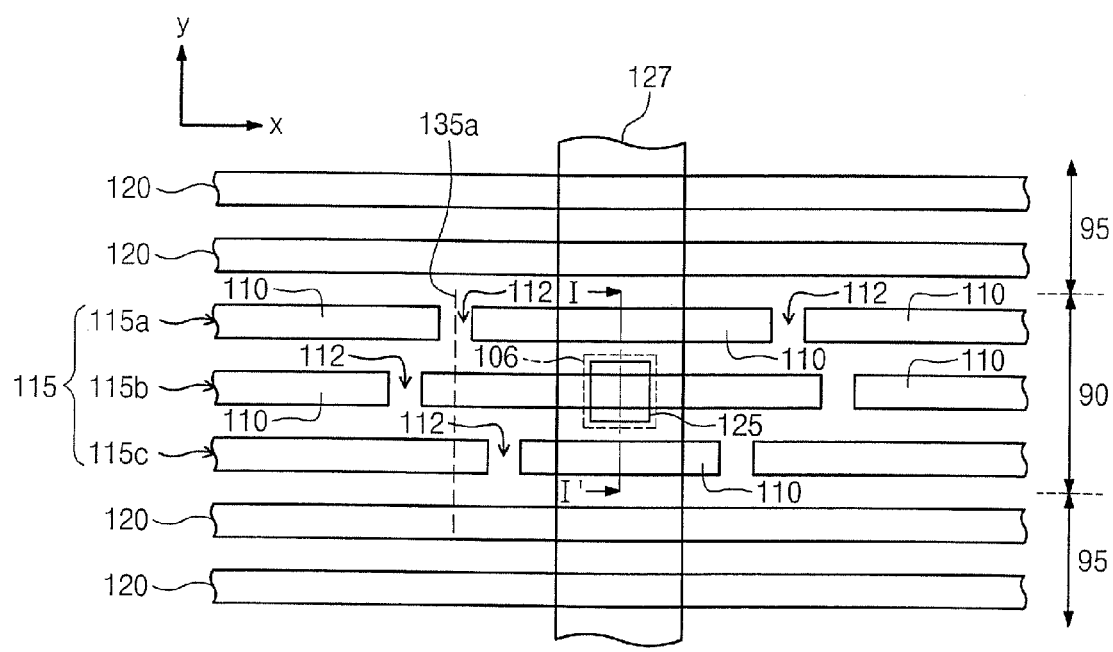
FIG. 2 is a plan view illustrating a semiconductor device in accordance with some embodiments of the present invention.
Figure 3:
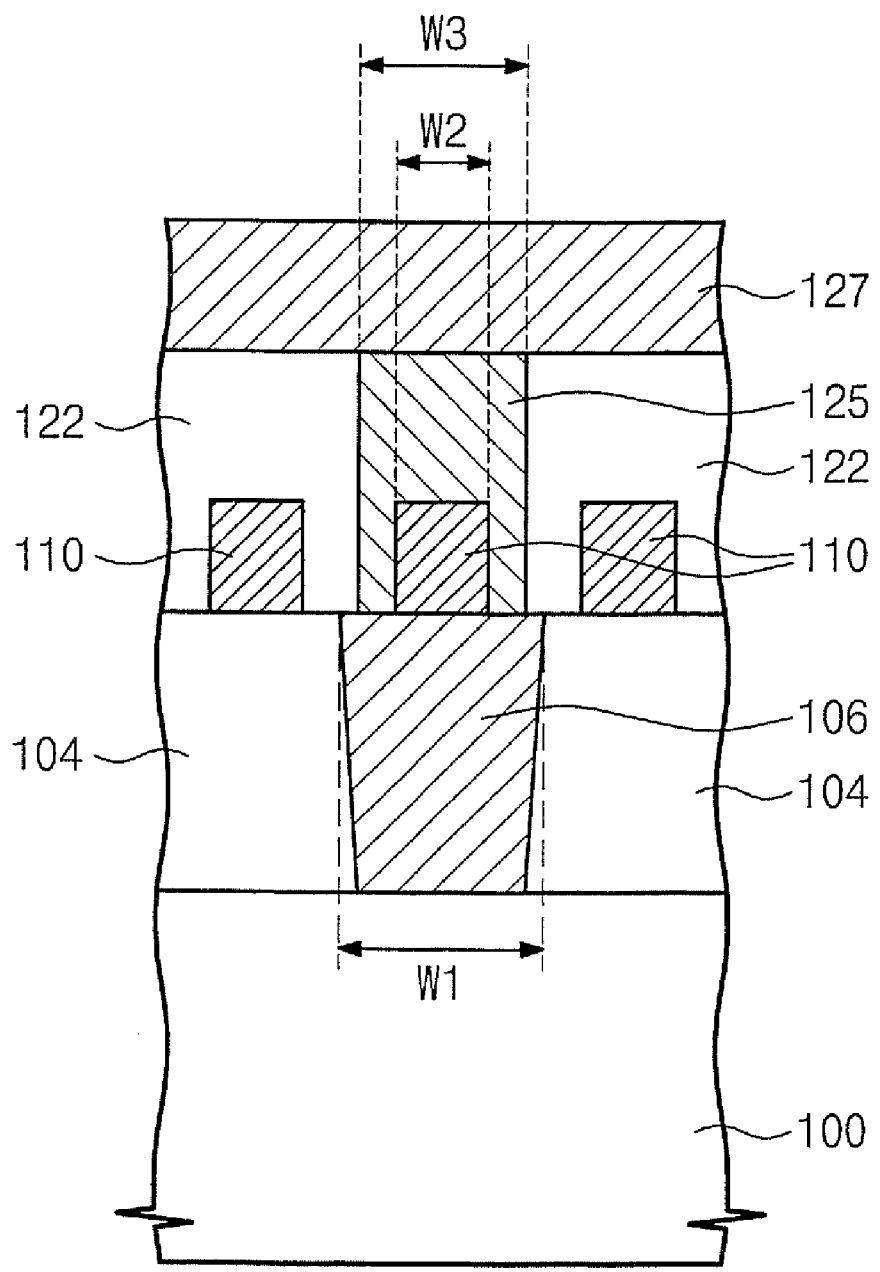
FIG. 3 is a cross sectional view taken along the line I-I' of FIG. 2.

FIG. 2 is a plan view illustrating a semiconductor device in accordance with some embodiments of the present invention, and FIG. 3 is a cross sectional view taken along the line I-I' of FIG. 2.

Referring to FIGS. 2 and 3, a first insulating layer 104 is disposed on an entire surface of a substrate 100 including a first region 90 and second regions 95. A plurality of dummy line patterns 115 are formed on the first insulating layer 104 in the first region 90. The dummy line patterns 115 can be configured to extend in a first direction parallel with each other. A plurality of active line patterns 120 are formed on the first insulating layer 104 in the second region 95. The active line patterns 120 may also extend along the first direction parallel to each other. The second region 95 may include discrete circuit elements of a semiconductor device. The discrete circuit element may form memory cells for storing data and/or logic units that form a logic circuit.

The memory cells may include volatile memory cells such as dynamic random access memory (DRAM) cells, static random access memory (SRAM) cells, and/or nonvolatile memory cells such as phase change memory cells, magnetic random access memory (MRAM) cells and/or flash memory cells having charge storage layers. The logic units may include inverters, AND gates, NAND gates, OR gates and/or NOR gates. The active line patterns 120 may be electrically connected to the discrete units and may be used as interconnections for conducting electrical signals. In some embodiments, the second region 95 may correspond to a cell array region and the active line patterns 120 may correspond to bit lines when the discrete circuit elements form memory cells.

One or both of the second regions 95 may be adjacent to at least one side of the first region 90 in a second direction that is perpendicular to the first direction. For example, the second regions 95 may be located on opposite sides of the first region 90 as shown in FIG. 2. The first region 90 may include a well or a conductive pattern disposed under the first insulating layer 104, and a predetermined voltage is applied to the well or the conductive pattern in the first region 90.

The active line patterns 120 may be parallel to the dummy line patterns 115. In FIG. 2, the first direction is illustrated as parallel to a horizontal-axis and the second direction, which is perpendicular to the first direction, is illustrated as parallel to a vertical-axis. The dummy line patterns 115 and the active line patterns 120 may be disposed to have the same distance therebetween along the second direction.

Each of the dummy line patterns 115 may include a plurality of sub-line patterns 110 which are spaced apart and separate from each other along a straight line parallel to the first direction, with at least one cutting region 112 therebetween. Therefore, the dummy line patterns 115 may each include a plurality of sub-line patterns 110 separated by a cutting region 112. The cutting region 112 can therefore correspond to space between a pair of adjacent sub-line patterns 110 along the first direction. The cutting region 112 may include a pair of first sides which are bounded by ends of the two adjacent sub-line patterns 110 along the first direction. The cutting region 112 may further include a pair of second sides which are bounded by two adjacent sub-line patterns 110 along the second direction.

The dummy line patterns 115 may include exemplary first to third dummy line patterns 115a, 115b and 115c, as shown in FIG. 2. The second dummy line pattern 115b can be between the first and third line patterns 115a and 115c. At least one of the cutting regions 112 separating the first dummy line pattern 115a in the first direction may be bounded in the second direction by one of the sub-line patterns 110 of the adjacent second dummy line pattern 115b. In other words, an imaginary straight line 135a, which passes in the second direction through the cutting region 112 of the first dummy line pattern 115a, may extend through one of the sub-line patterns 110 of the second dummy line pattern 115b adjacent to the first dummy line pattern 115a.

As shown, one of the sub-line patterns 110 of the second dummy line pattern 115b intervenes between at least one of the cutting regions 112 of the first dummy line pattern 115a and at least one of the cutting regions 112 of the third dummy line pattern 115c. Thus, when an exposure process is carried out to define the sub-line patterns 110, the cutting regions 112, and the active line patterns 120, the light that is irradiated onto the cutting regions 112 may cause significantly less interference phenomenon. Accordingly, forming staggered gaps between adjacent sub-line patterns 110 may enable the sub-line patterns 110 to be formed with improved shape.

Various reasons why the light interference phenomenon may be suppressed will be described in more detail with regard to FIGS. 2 and 3. A conductive layer is formed on the first insulating layer 104, and a photoresist layer is formed on the conductive layer. A photolithography process that includes an exposure step and a development step is then applied to the photoresist layer, thereby forming photoresist patterns. The photoresist patterns may include first photoresist patterns defining the dummy line patterns 115 and second photoresist patterns defining the active line patterns 120. Each of the first photoresist patterns may include a plurality of sub-photoresist patterns which are separated from each other along the first direction. Spaces between the sub-photoresist patterns of the respective first photoresist patterns are defined by the cutting regions 112. At least one of the spaces defining the cutting regions 112 overlaps with, and is bounded by, an adjacent one of the sub-photoresist patterns of the first photoresist pattern. The adjacent sub-photoresist pattern may suppress occurrence of an interference phenomenon by light irradiated onto the adjacent cutting regions 112 and, as a result, may reduce/prevent deformation of the sub-photoresist patterns during the photolithography process. The conductive layer is then etched using the first and second photoresist patterns as etch masks, thereby forming the dummy line patterns 115 and the active line patterns 120. The dummy line patterns 115 and the active line patterns 120 may be formed under the first photoresist patterns and the second photoresist patterns, respectively. For example, the sub-line patterns 110 may be formed under the sub-photoresist patterns.

The dummy line patterns 115 and the active line patterns 120 may be formed simultaneously. The dummy line patterns 115 and the active line patterns 120 may be formed of a metal layer (for example, a tungsten layer, an aluminum layer, and/or a copper layer), a conductive metal nitride layer (for example, a titanium nitride layer and/or a tantalum nitride layer), and/or a metal silicide layer (for example, a tungsten silicide layer).

As shown in FIG. 2, the imaginary straight line 135a extends along the second direction and passes through a cutting region 112 and one or more sub-line patterns 110. Accordingly, each of the cutting regions 112 can be aligned in the second direction with (bounded by) an adjacent one of the sub-line patterns 110 of the dummy line pattern 115. For example, one of the cutting regions 112 of the second dummy line pattern 115b may overlap with the sub-line patterns 110 of the first and third dummy line patterns 115a and 115c, as shown in FIG. 2. In other words, the sub-line patterns 110 of the second dummy line pattern 115b may intervene in the second direction between the cutting regions 112 of the first dummy line pattern 115a and the cutting regions 112 of the third dummy line pattern 115c. As a result, the overlapping or intervening sub-line patterns 110 may suppress occurrence of the interference phenomenon when light is irradiated onto the cutting regions 112.

As describe above, the dummy line patterns 115 and the active line patterns 120 may be formed to have the same width and the same distance therebetween in second direction, which may reduce the occurrence of non-uniformity in the profiles of the second photoresist patterns that define the active line patterns 120 during the photolithography process that forms the second photoresist patterns.

In contrast, when the line patterns 115 and 120 are defined so as to not have the same width or the same distance therebetween in the second direction, a loading effect may occur during formation of the photoresist patterns that defines the line patterns 115 and 120. The loading effect may lead to abnormal pattern profiles in the photoresist patterns.

One of the sub-line patterns 110 may cross over and directly connect to a lower contact plug 106 that penetrates the first insulating layer 104. The lower contact plug 106 may have a first width W1 along the second direction, and the sub-line pattern 110 connected to the lower contact plug 106 may have a second width W2 along the second direction. The first width W1 may be greater than the second width W2, which may increase the alignment margin between the lower contact plug 106 and the sub-line pattern 110.

The lower contact plug 106 may be electrically connected to the substrate 100. For example, the lower contact plug 106 may be electrically connected to a well which is formed in the substrate 100. Thus, a well bias may be supplied to the well through the lower contact plug 106 and the sub-line pattern 110 thereon. The well may correspond to a body region which includes a channel region of a MOS transistor constituting the discrete unit. Alternatively, the well may correspond to a guard well region which surrounds the body region. The body region may be doped with impurities having a different conductivity type from source/drain regions of the MOS transistor, and the guard well may be doped with impurities having a different conductivity type from the body region. In other embodiments, an additional conductive pattern may be disposed between the lower contact plug 106 and the substrate 100. The lower contact plug 106 may be formed of a conductive material layer. For example, the lower contact plug 106 may include at least one selected from the group consisting of a doped semiconductor, a metal layer (e.g., a tungsten layer, an aluminum layer, and/or a copper layer), a conductive metal nitride layer (e.g., a titanium nitride layer and/or a tantalum nitride layer), and/or a metal silicide layer (e.g., a tungsten silicide layer and/or a cobalt silicide layer).

A second insulating layer 122 covers the first insulating layer 104, the dummy line patterns 115, and the active line patterns 120. The second insulating layer 122 may be a single layer of insulating material or multi insulating layers. An upper contact plug 125 passes through the second insulating layer 122, and the upper contact plug 125 is connected to the sub-line pattern 110 which overlies the lower contact plug 106. The upper contact plug 125 may have a third width W3 along the second direction. The third width W3 may be less than the first width W2. In this case, when the upper contact plug 125 is slightly misaligned with respect to the lower contact plug 106, the upper contact plug 125 may be stacked over the lower contact plug 106 without occurrence of an electrical short between the upper contact plug 125 and the adjacent sub-line pattern 110.

Further, the third width W3 may be greater than the second width W2, so that when the upper contact plug 125 is slightly misaligned with respect to the sub-line pattern 110 overlying the lower contact plug 106, the contact area between the upper contact plug 125 and the sub-line pattern 110 thereunder may be increased.

In some other embodiments, the sub-line patterns 110 on opposite sides of the sub-line pattern 110 overlying the lower contact plug 106 may be electrically floated, which may avoid malfunction of the semiconductor device when at least one of the lower and upper contact plugs 106 and 125 is misaligned along the second direction to be in contact with the floated sub-line patterns 110.

The sub-line pattern 110 overlying the lower contact plug 106 may be separated from the other sub-line patterns 110 which are disposed along the first direction. Thus, the well bias applied to the lower and upper contact plugs 106 and 125 may not be supplied to the other sub-line patterns 110. Accordingly, even though the other sub-line patterns 110 are electrically connected to other discrete units, the semiconductor device may operate normally.

An interconnection 127 may be disposed on the second insulating layer 122, and the interconnection 127 may be connected to the upper contact plug 125. As a result, when the well bias is applied to the interconnection 125, the well bias may be supplied to the substrate 100 through the upper contact plug 125 and the lower contact plug 106. The interconnection 127 may extend along the second direction, as shown in FIG. 2. Alternatively, the interconnection 127 may extend along a different direction from the second direction as defined by a design schematic of the semiconductor device.

The upper contact plug 125 and the interconnection 127 may be formed of a conductive layer. For example, each of the upper contact plug 125 and the interconnection 127 may include at least one selected from the group consisting of a doped semiconductor, a metal layer (e.g., a tungsten layer, an aluminum layer, and/or a copper layer), a conductive metal nitride layer (e.g., a titanium nitride layer and/or a tantalum nitride layer), and/or a metal silicide layer (e.g., a tungsten silicide layer and/or a cobalt silicide layer). The upper contact plug 125 may be the same material layer as the interconnection 127, or may be a different material layer from the interconnection 127.

In the semiconductor device shown in FIG. 2, each cutting region 112 of a specific dummy line pattern 115 may overlap (be bounded) in the second direction with the adjacent sub-line pattern 110 of another one of the dummy line patterns 115. The present invention is not limited to the embodiments shown in FIG. 2. For example, the embodiment of FIG. 2 may be modified in many different forms as illustrated by the other exemplary embodiments in FIGS. 4, 5 and 6.

Figure 4:
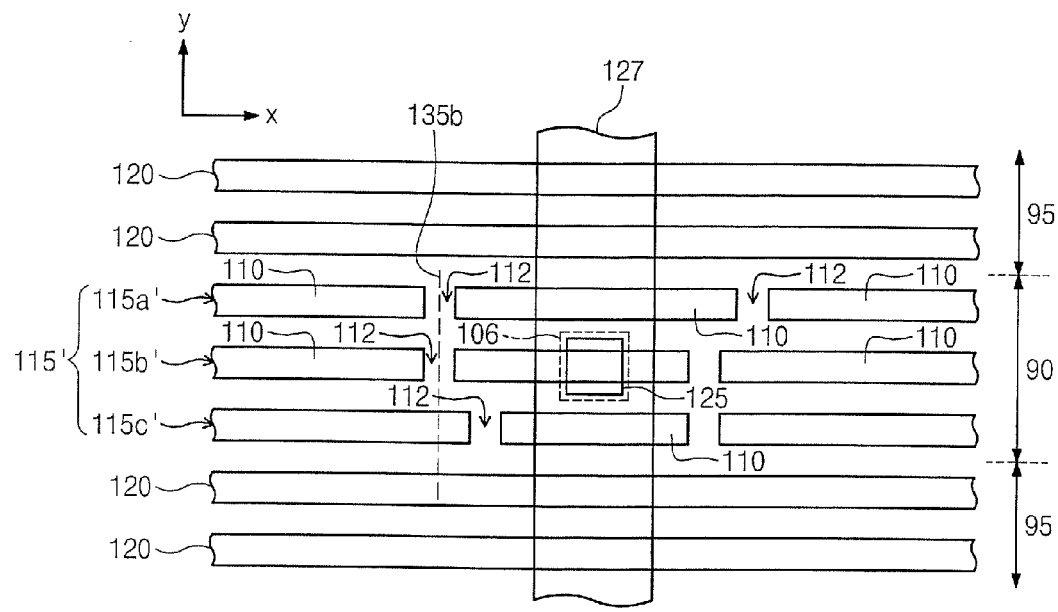
FIG. 4 is a plan view illustrating some alternative embodiments of the semiconductor device shown in FIG. 2.

FIG. 4 is a plan view illustrating some alternative embodiments of the semiconductor device shown in FIG. 2.

Referring to FIG. 4, a plurality of parallel dummy line patterns 115' are formed that extend parallel one another along a first direction, which is illustrated as parallel to the horizontal-axis. The dummy line patterns 115' may include first to third dummy line patterns 115a', 115b' and 115c'. The second dummy line pattern 115b' is disposed between the first and third line patterns 115a' and 115c'. Each of the dummy line patterns 115a', 115b' and 115c' may include a plurality of sub-line patterns 110 which are separated from each other along the first direction by at least one cutting region 112, as described with reference to FIG. 2.

An imaginary straight line 135b, which extends along a second direction (the illustrated vertical-axis direction) perpendicular to the first direction, may pass through at least one sub-line pattern 110 and a plurality of cutting regions 112. Adjacent ones of the plurality of cutting regions 112 can be aligned along the imaginary straight line 135b. Further, at least one of the cutting regions 112 of a specific dummy line pattern 115' may overlap with (be bounded by) the sub-line pattern 110 of another adjacent dummy line pattern 115' in the second direction. For example, the cutting regions 112 of the first and second dummy line patterns 115a' and 115b', which are aligned with the imaginary straight line 135b, may be adjacent to each other. Moreover, the cutting region 112 of the second dummy line pattern 115b', which is aligned with the imaginary straight line 135b, may overlap with (be bounded by) the adjacent sub-line pattern 110 of the third dummy line pattern 115c' along the second direction.

Figure 5:
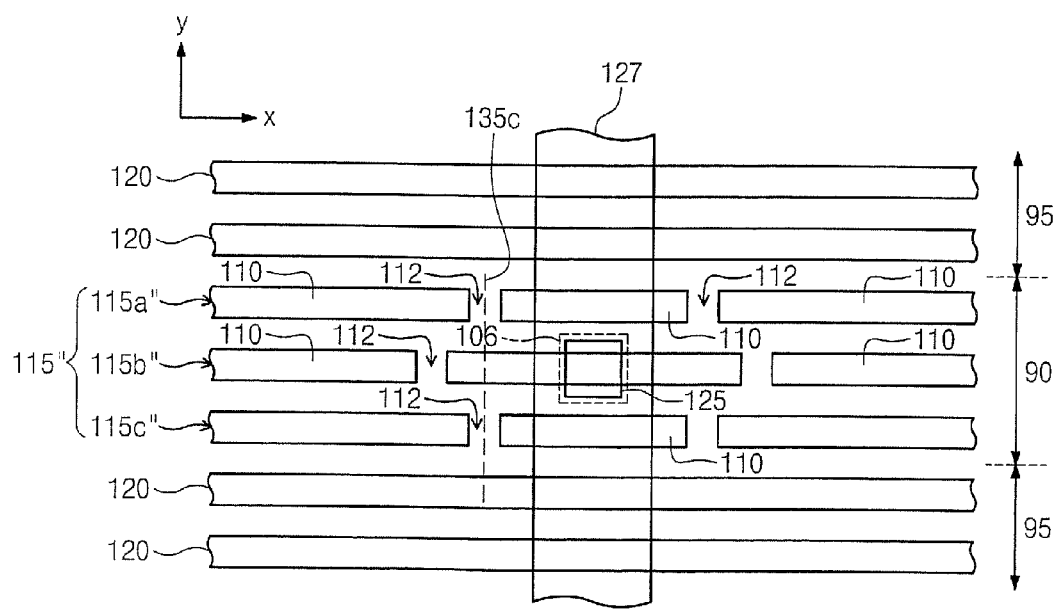
FIG. 5 is a plan view illustrating still some other alternative embodiments of the semiconductor device shown in FIG. 2.

FIG. 5 is a plan view illustrating still some other alternative embodiments of the semiconductor device shown in FIG. 2.

Referring to FIG. 5, a plurality of parallel dummy line patterns 115" extend along a first direction which is parallel to the illustrated horizontal-axis. The dummy line patterns 115" may comprise first to third dummy line patterns 115a", 115b" and 115c". The second dummy line pattern 115b" is disposed between the first and third line patterns 115a" and 115c". Each of the dummy line patterns 115a", 115b" and 115c" may include a plurality of sub-line patterns 110 which are separated and spaced apart from each other along the first direction by at least one cutting region 112, as described with reference to FIG. 2.

An imaginary straight line 135c, which extends along a second direction (the illustrated vertical-axis direction) perpendicular to the first direction, may pass through at least two cutting regions 112 and one sub-line pattern 110 therebetween. For example, the cutting regions 112 of the first and third dummy line patterns 115a" and 115b" may be aligned with the imaginary straight line 135c, and the sub-line pattern 110 of the second dummy line pattern 115b" may intervene between the cutting regions 112 of the first and third dummy line patterns 115a" and 115b".

A portion of the upper contact plug 125 may directly contact the lower contact plug 106, as shown in FIG. 3. Alternatively, a landing pad which includes the sub-line patterns 110 and extensions therebetween, as illustrated in FIGS. 6 and 7, the intervene between and spaced apart the lower and upper contact plugs.

Figure 6:
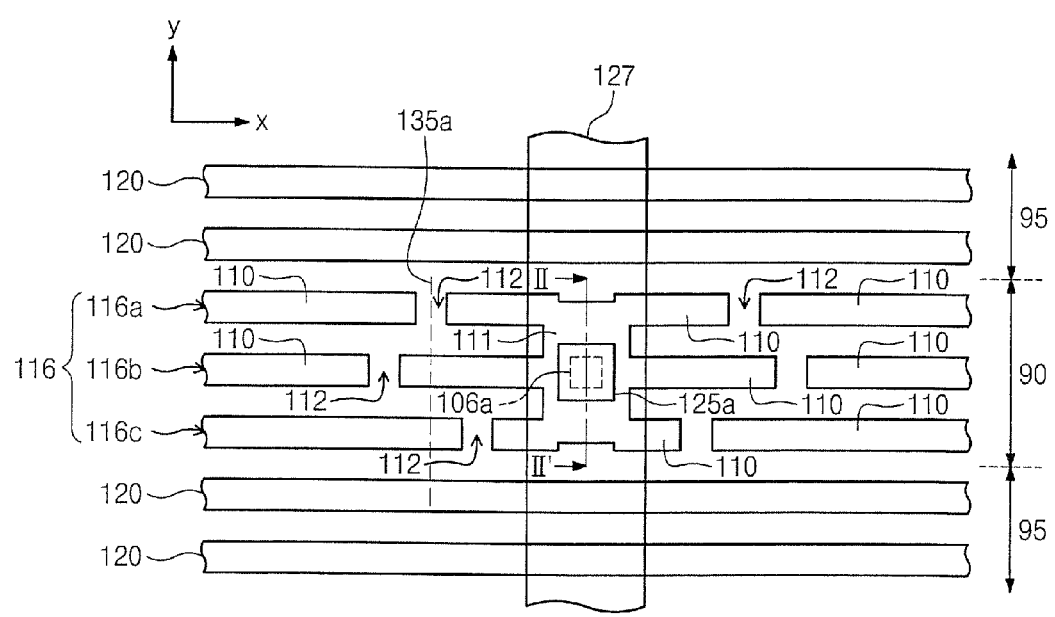
FIG. 6 is a plan view illustrating still some other alternative embodiments of the semiconductor device shown in FIG. 2.
Figure 7:
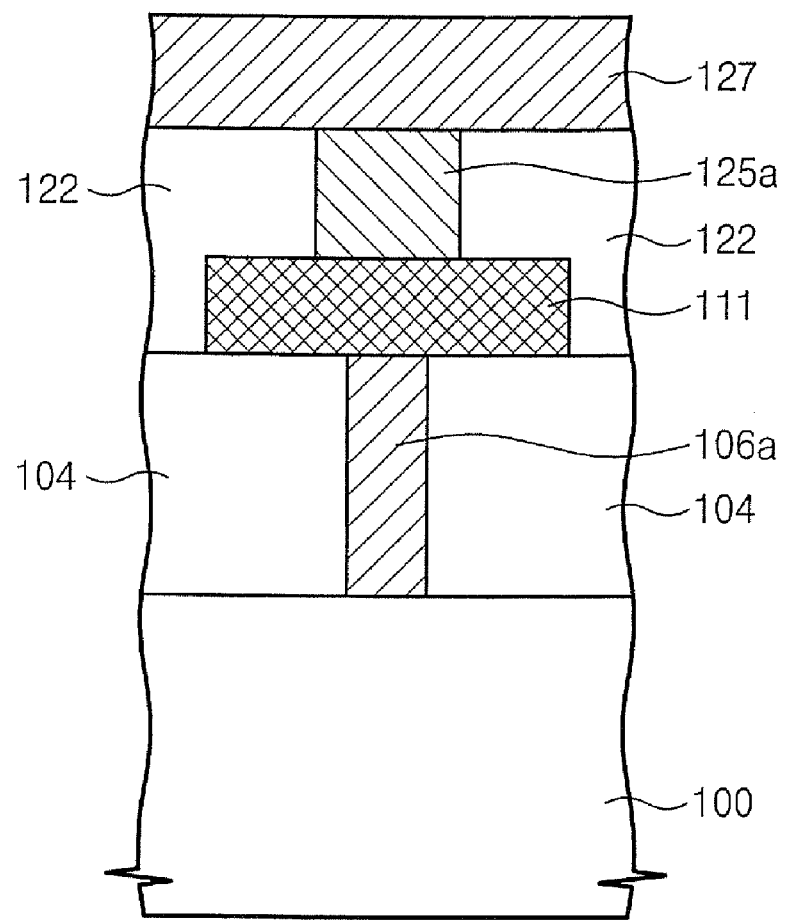
FIG. 7 is a cross sectional view taken along the line II-II' of FIG. 6.

FIG. 6 is a plan view illustrating still other alternative embodiments of the semiconductor device shown in FIG. 2, and FIG. 7 is a vertical cross sectional view taken along the line II-II' of FIG. 6.

Referring to FIGS. 6 and 7, a plurality of parallel dummy line patterns 116 are formed that extend along a first direction which is parallel to the illustrated horizontal-axis. The dummy line patterns 116 may include first to third dummy line patterns 116a, 116b and 116c. The second dummy line pattern 116b is between the first and third line patterns 116a and 116c. Each of the dummy line patterns 116a, 116b and 116c may include a plurality of sub-line patterns 110 which are separated from each other along the first direction by at least one cutting region 112, as described with reference to FIG. 2.

A portion of the sub-line pattern 110 of the second dummy line pattern 116b extends along the second direction (in both directions along the illustrated vertical-axis) to contact the sub-line patterns 110 of the first and third dummy line patterns 116a and 116c which are located on opposite sides of the second dummy line pattern 116b. Therefore, a landing pad 111 may be provided between the adjacent sub-line patterns 110 of the first to third dummy line patterns 116a, 116b and 116c. The landing pad 111 may include the specific sub-line pattern 110 of the second dummy line pattern 116b, the extensions from the specific sub-line pattern 110, and the sub-line patterns 110 contacting the extensions from the specific sub-line pattern 110.

An upper contact plug 125a may penetrate the second insulating layer 122 and may contact a top surface of the landing pad 111. Further, a lower contact plug 106a may penetrate the first insulating layer 104 and may contact a bottom surface of the landing pad 111. The lower contact plug 106a may include a plurality of sub lower contact plugs which are separated from each other in the first insulating layer 104. In this case, the plurality of sub lower contact plugs may contact the bottom surface of the landing pad 111.

Although not shown in FIGS. 6 and 7, the lower contact plug 106a may be disposed under at least one of the sub-line patterns 110 which protrude from the landing pad 111 along the first direction. In this case, the lower contact plug 106a may be spaced apart from the upper contact plug 125a when viewed from the top plan view of FIG. 6. The detailed description to these embodiments will be described with reference to FIG. 12.

According to the semiconductor devices described above, at least one of the cutting regions 112 between the sub-line patterns 110 of a specific dummy line pattern may overlap with (be bounded by) the adjacent sub-line pattern 110 of the other dummy line pattern along the second direction. Hence, when a photolithography process is performed to form sub-photoresist patterns defining the sub-line patterns 110 and the cutting regions 112, light irradiated onto the cutting regions 112 may result in substantially less interference phenomenon because of the presence of the overlapping sub-line pattern 110. As a result, the sub-photoresist patterns on the sub-line patterns 110 may be formed more accurately, with less deformation, during the photolithography process. The active line patterns 120 may be more uniformly formed with the dummy line patterns having the same width and distance as the adjacent active line patterns 120.

The layout schemes described above may be applied to various semiconductor devices. For example, the semiconductor device described above may be a dynamic random access memory (DRAM) device, a static random access (SRAM) device, a phase change memory device, a magnetic random access memory (MRAM) device, a logic device or an embedded memory logic (EML) device that includes at least one of the embodiments described herein.

Second Set of Embodiments

Hereinafter, a non-volatile memory device to which one of the layout schemes illustrated in FIGS. 2, 4, 5 and 6 is applied will be described. The non-volatile memory device may include charge storage layers.

Figure 8:
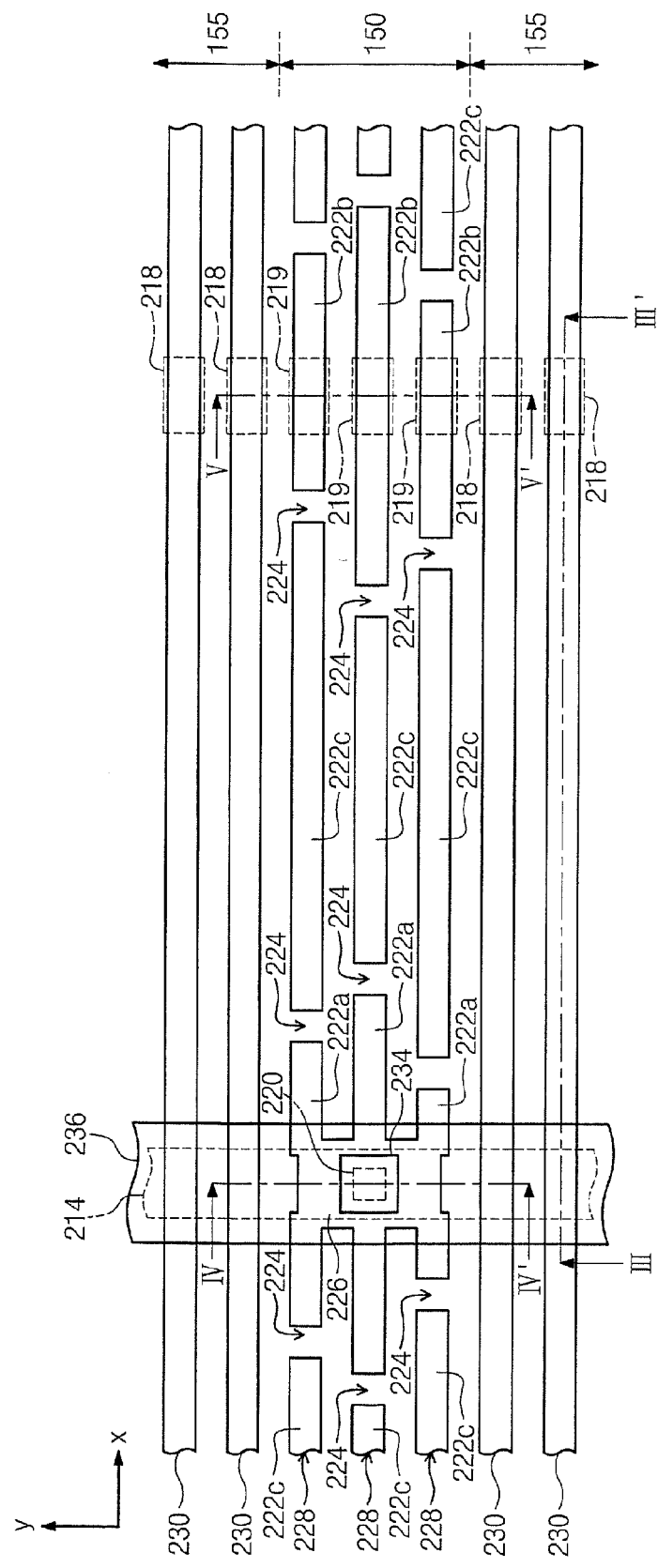
FIG. 8 is a plan view illustrating a semiconductor device in accordance with some other embodiments of the present invention.
Figure 9:
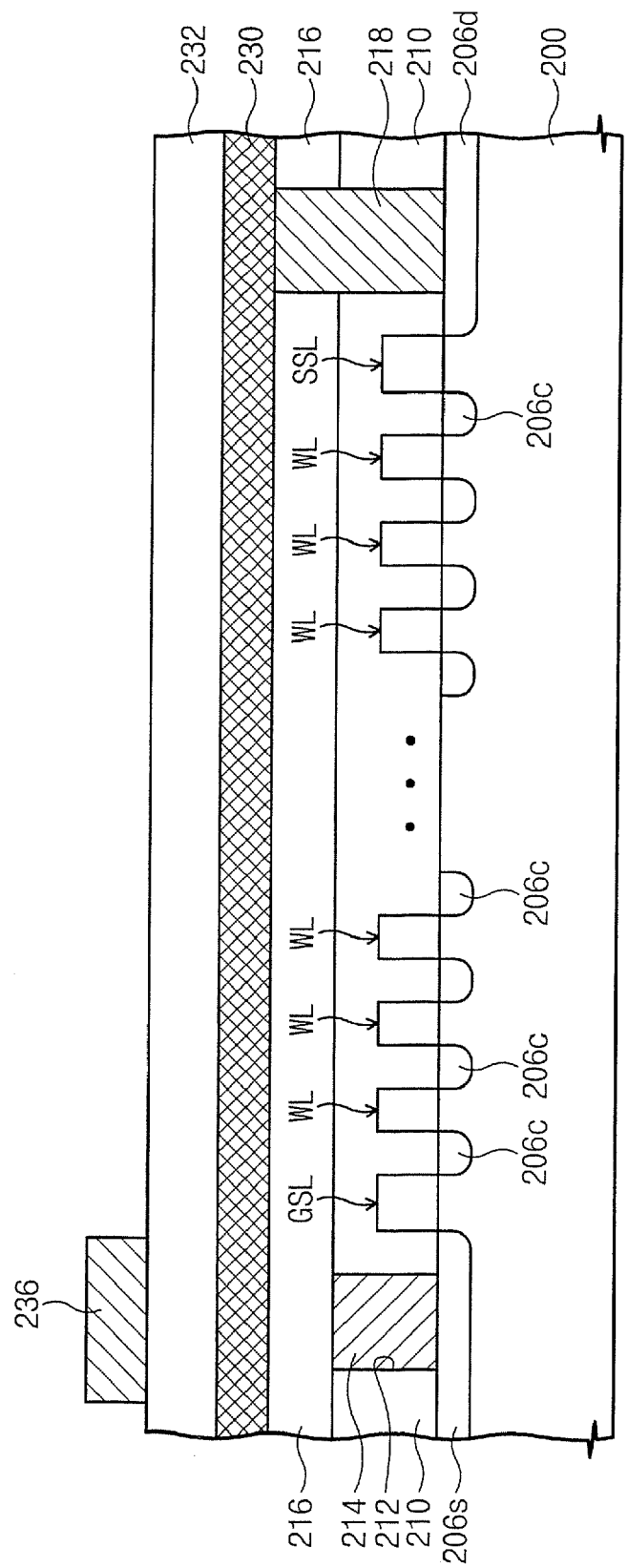
FIG. 9 is a cross sectional view taken along the line III-III' of FIG. 8.
Figure 10:
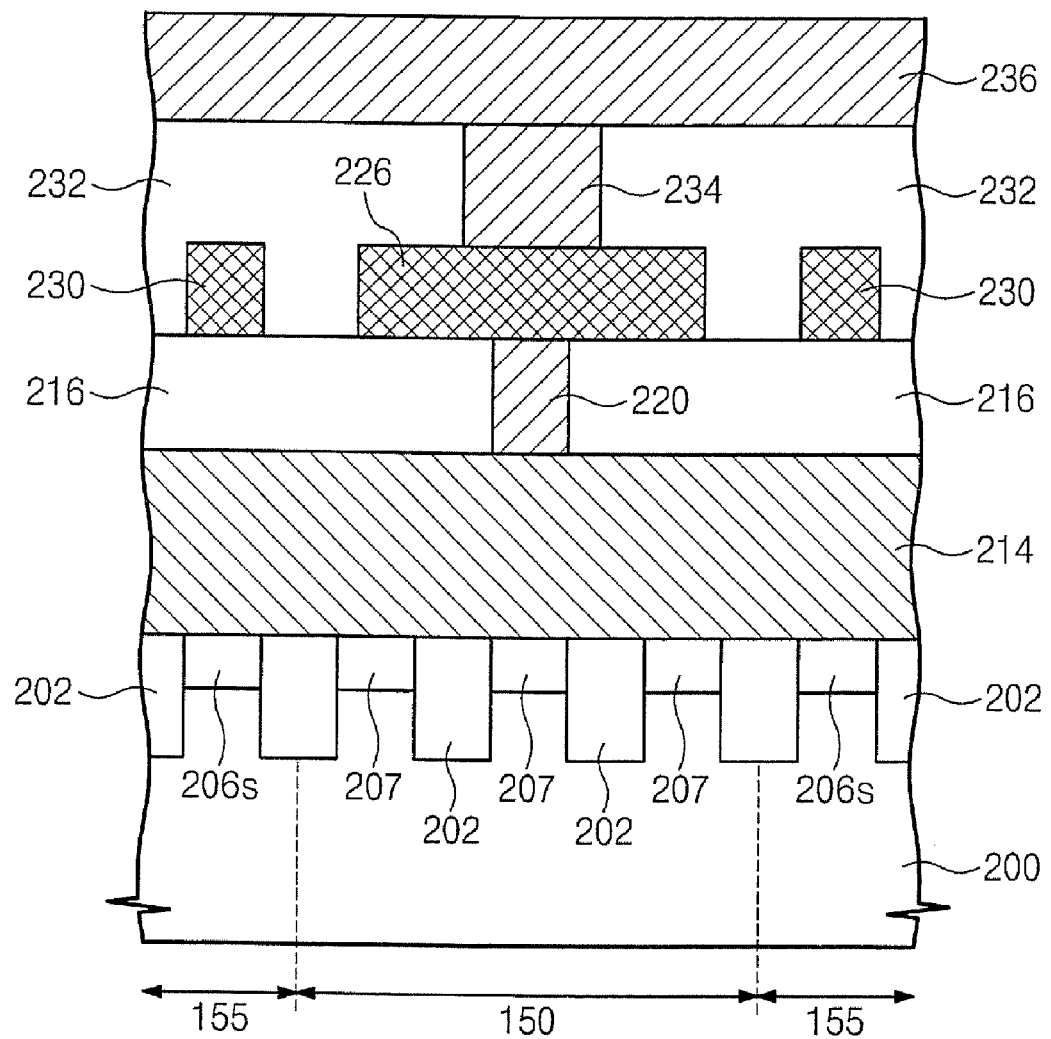
FIG. 10 is a cross sectional view taken along the line IV-IV' of FIG. 8.
Figure 11:
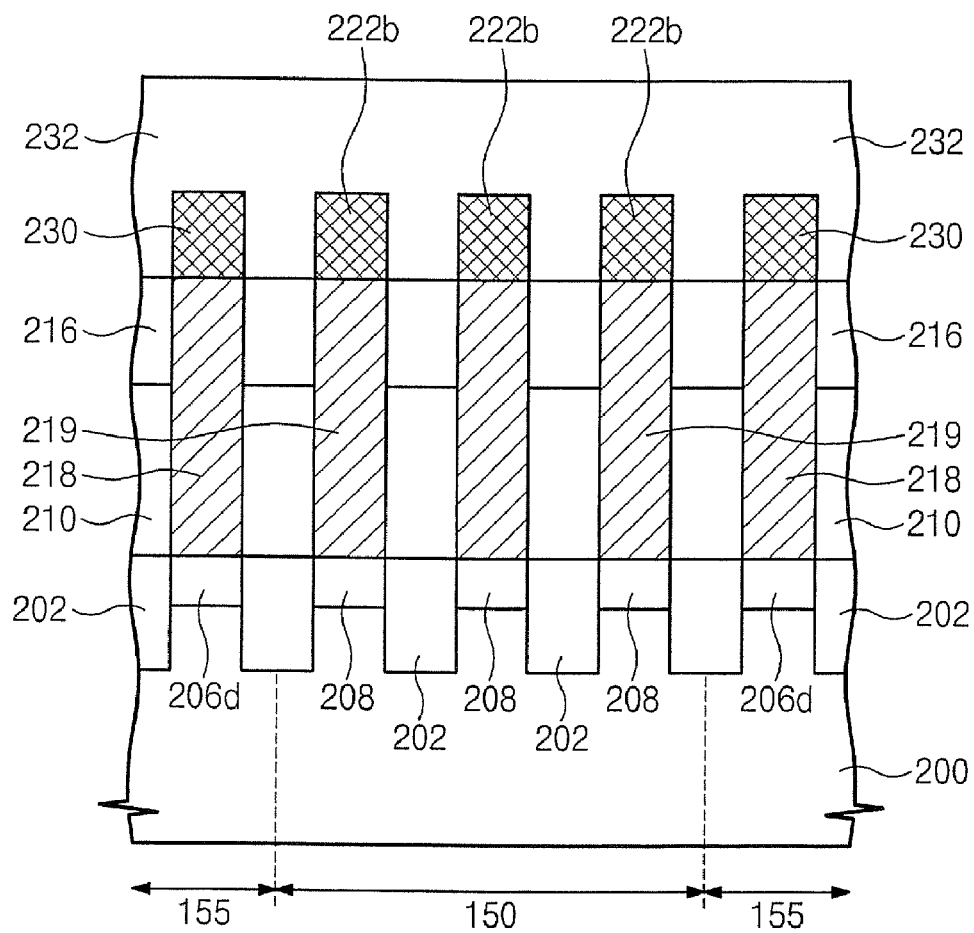
FIG. 11 is a cross sectional view taken along the line V-V' of FIG. 8.

FIG. 8 is a plan view illustrating the non-volatile memory device according to some other embodiments of the present invention, and FIGS. 9, 10 and 11 are cross sectional views taken along the lines III-III', IV-IV' and V-V', respectively.

Referring to FIGS. 8, 9, 10 and 11, an isolation layer 202 is formed on a substrate 200 having first and second regions 150 and 155 to define active regions. The active regions may be disposed in a well which is doped with impurities having a first conductivity type. The second region 155 may correspond to a cell array region, and the first region 150 may correspond to a core region for supplying a predetermined voltage to the well or a conductive pattern (e.g., a common source line). The active regions may be formed so as to be parallel with a first direction. The first direction may be parallel to horizontal-axis of the drawing of FIG. 1, and a second direction perpendicular to the first direction may be parallel to a vertical-axis in FIG. 1. The active regions may include first active regions disposed in the first region 150 and second active regions disposed in the second region 155. The first and second active regions may be formed so as to have the same distance therebetween.

A ground selection line GSL, a plurality of word lines WL and a string selection line SSL may cross over the first and second active lines and be parallel to the second direction. Cell source/drain regions 206*c* are provided in the second active regions which are located at both sides of the word lines WL. Further, source region 206*s* are provided in the second active regions which are adjacent to the ground selection line GSL and opposite the string selection line SSL, and drain regions 206*d* are provided in the second active regions which are adjacent to the string selection line SSL and opposite the ground selection line GSL. As a result, the ground selection line GSL, the plurality of word lines WL and the string selection line SSL are disposed to cross over the first and second active regions between the source regions 206*s* and drain regions 206*d*. The cell source/drain regions 206*c*, the source regions 206*s* and the drain regions 206*d* may be impurity regions which are doped with dopants having a second conductivity type. The source regions 206*s* may be arrayed on a first row which is parallel to the second direction. Similarly, the drain regions 206*d* may be arrayed on a second row which is parallel to the second direction.

First doped regions 207 may be provided in the first active regions which are adjacent to the ground selection line GSL and opposite the string selection line SSL, and second doped regions 208 may be provided in the first active regions which are adjacent to the string selection line SSL and opposite the ground selection line GSL. As a result, the ground selection line GSL and the string selection line SSL may be disposed to cross over the first active regions between the first doped regions 207 and the second doped regions 208. The first doped regions 207 may be arrayed along the first row, and the second doped regions 208 may be arrayed along the second row. That is, the first doped regions 207 and the source regions 206*s* may be located on the first row, and the second doped regions 208 and the drain regions 206*d* may be located on the second row.

The first doped regions 207 may have the same conductivity type as the source regions 206*s*. Alternatively, the first doped regions 207 may have the same conductivity type as the first and second active regions. In this case, the dopant concentration of the first doped regions 207 may be higher than that of the first and second active regions. The second doped regions 208 may have the same conductivity type as the drain regions 206*d*. Alternatively, the second doped regions 208 may have the same conductivity type as the first and second active regions. When the second doped regions 208 and the first and second active regions have the same conductivity type, the dopant concentration of the second doped regions 208 may be higher than the first and second active regions.

Each of the word lines WL may include a tunnel insulating layer, a charge storage layer, a blocking layer, and a control gate which are sequentially stacked. The charge storage layer may include a semiconductor layer, such as a silicon layer or a silicon-germanium layer, which is referred to as a floating gate. Alternatively, the charge storage layer may comprise an insulating layer having deep level traps in which charges are trapped, such that the insulating layer may be referred to as a charge trapping layer and may include a silicon nitride layer and/or nanocrystals.

The blocking layer may include an insulating layer such as an oxide-nitride-oxide (ONO) layer. Alternatively, the blocking layer may comprise a high-k dielectric layer having a higher dielectric constant than the tunnel insulating layer. For example, the blocking layer may include an insulating metal oxide layer such as a hafnium oxide layer and/or an aluminum oxide layer. The control gate may be a conductive material layer. For example, the control gate may include at least one selected from the group consisting of a doped semiconductor, a metal layer (e.g., a tungsten layer and/or a molybdenum layer), a conductive metal nitride layer (e.g., a titanium nitride layer and/or a tantalum nitride layer), and/or a metal silicide layer (e.g., a tungsten silicide layer and/or a cobalt silicide layer).

The ground selection line GSL may include a gate insulating layer and a gate electrode which are sequentially stacked. Similarly, the string selection line SSL may also include a gate insulating layer and a gate electrode which are sequentially stacked.

A first insulating layer 210 is formed on an entire surface of the substrate including the line GSL, SSL and WL. A common source line 214 may be formed in the first insulating layer 210. The common source line 214 may be formed at one side of the ground selection line GSL and extend along the second direction. Further, the common source line 214 may be electrically connected to the source regions 206*s*. In addition, the common source line 214 may be connected to the first doped regions 207. The common source line 214 may be formed to fill a groove in the first insulating layer 210, and a top surface of the common source line 214 may be coplanar with that of the first insulating layer 210.

If the same bias is applied to the source regions 206*s* as well as the first and second active regions (e.g., the well having the first conductivity type), the first doped regions 207 in the first active regions may have a different conductivity type from the source regions 206*s*. That is, the first doped regions 207 may have the first conductivity type, and the source regions 206*s* may have the second conductivity type. Alternatively, if a first bias is applied to the source regions 206*s* and a second bias different from the first bias is applied to the first and second active regions (e.g., the well having the first conductivity type), the first doped regions 207 in the first active regions may have the same conductivity type as the source regions 206*s* in the second active regions. That is, the first doped regions 207 and the source regions 206*s* may have the second conductivity type.

A second insulating layer 216 may be disposed on the common source line 214 and the first insulating layer 210. A plurality of dummy line patterns 228 and a plurality of bit lines 230 are disposed on the second insulating layer 216 to be parallel with the first direction. The plurality of dummy line patterns 228 are disposed on the second insulating layer 216 in the first region 150, and the plurality of bit lines 230 are disposed on the second insulating layer 216 in the second region 155. The plurality of dummy line patterns 228 may be disposed over the first active regions, respectively. Similarly, the plurality of bit lines 230 may be disposed over the second active regions, respectively. The dummy line patterns 228 and the bit lines 230 may be arranged to have substantially the same distance there between along the second direction. The dummy line patterns 228 and the bit lines 230 may have substantially the same width.

Each of the dummy line patterns 238 may include a plurality of sub-line patterns which are spaced apart from each other in the first direction by cutting regions 224. For example, the respective dummy line patterns 238 may include first to third sub-line patterns 222a, 222b and 222c. The first sub-line patterns 222a of the dummy line patterns 238 may cross over the common source line 214, and the second sub-line patterns 222b of the dummy line patterns 238 may run over the second doped regions 208, respectively. Further, the third sub-line patterns 222c may be disposed between the first sub-line patterns 222a and the second sub-line patterns 222b.

The first to third sub-line patterns 222a, 222b and 222c may be repeatedly arrayed to be symmetrical with respect to the common source line 214. Thus, the third sub-line patterns 222c may be disposed at opposite sides of the respective first sub-line patterns 222a, and the third sub-line patterns 222c may also be disposed at opposite sides of the respective second sub-line patterns 222b.

As shown in FIG. 8, at least one of the cutting regions 224 of the specific dummy line pattern 228 may overlap (be bounded by) with an adjacent one of the sub-line patterns 222a, 222b and 222c of the other dummy line pattern 228 along the second direction. Accordingly, an imaginary straight line, which passes through one of the cutting regions 224 of the specific dummy line pattern 228 and extends along the second direction, may run across an adjacent one of the sub-line patterns 222a, 222b and 222c of the other dummy line pattern 228. Thus, when a photolithography process is performed to form sub-photoresist patterns defining the sub-line patterns 222a, 222b and 222c and the cutting regions 224, the light irradiated onto the cutting regions 224 may cause significantly less interference thereto because of the presence of the overlapping sub-line pattern 222a, 222b or 222c.

In the present embodiments, the dummy line patterns 228 including the sub-line patterns 222a, 222b and 222c and the cutting regions 224 may have the same configuration as the dummy line patterns 116 shown in FIG. 6. However, the dummy line patterns 228 may be modified in many different forms. For example, the dummy line patterns 228 may be replaced with the dummy line patterns 115 illustrated in FIG. 2, the dummy line patterns 115' illustrated in FIG. 4, or the dummy line patterns 115" illustrated in FIG. 5.

A lower source plug 220 may be formed in the second insulating layer 216, and the lower source plug 220 may be electrically connected to the common source line 214. The lower source plug 220 may contact at least one of the first sub-line patterns 222a. Some portions of the adjacent first sub-line patterns 222a may extend along the second direction to provide a landing pad 226, as shown in FIG. 8. In this case, the lower source plug 220 may contact a bottom surface of the landing pad 226, as shown in FIG. 10. Both ends of the respective first sub-line patterns 222a may correspond to protrusions which extend from the landing pad 226 along the first direction. The landing pad 226 may be disposed over the common source line 214.

A third insulating layer 232 is formed on the dummy line patterns 228, the bit lines 230 and the second insulating layer 216. The landing pad 226 may be connected to an upper source plug 234 that penetrates the third insulating layer 232. An interconnection 236 may be disposed on the third insulating layer 232, and the interconnection 236 may be connected to the upper source plug 234. Therefore, a predetermined voltage (e.g., a ground voltage) applied to the interconnection 236 may be supplied to the common source line 214 through the upper source plug 234, the landing pad 226 and the lower source plug 220. The protrusions of the first sub-line patterns 222a are separated from the third sub-line patterns 222c by the cutting regions 224. Thus, the predetermined voltage applied to the interconnection 236 is not supplied to the second and third sub-line patterns 222b and 222c and is supplied to the common source line 214 through the first sub-line patterns 222a.

When the dummy line patterns 228 are replaced with the dummy line patterns 115 illustrated in FIG. 2, the dummy line patterns 115' illustrated in FIG. 4, or the dummy line patterns 115" illustrated in FIG. 5, the landing pad 226 are not provided. Thus, the lower source plug 220 may be in contact with one of the first sub-line patterns 222a. In this case, the width of the lower source plug 220 along the second direction may be greater than the width of the first sub-line pattern 222a along the second direction, as described with reference to FIG. 3. Further, the width of the upper source plug 234 along the second direction may be less than the width of the lower source plug 220, as described with reference to FIG. 3. In addition, the width of the upper source plug 234 may be greater than the width of the first sub-line pattern 222a.

Referring again to FIGS. 8, 9 and 11, a plurality of bit line plugs 218 may penetrate the first and second insulating layers 210 and 216 to contact the drain regions 206d, respectively. The bit line plugs 218 may be connected to the bit lines 230, respectively. The bit line plugs 218 may be arrayed on the second row which is parallel to the second direction. A plurality of lower contact plugs 219 penetrate the first and second insulating layers 210 and 216 to contact the second doped regions 208, respectively. The lower contact plugs 219 may be connected to the second sub-line patterns 222b, respectively. The second sub-line patterns 222b are separated from the adjacent third sub-line patterns 222c. Thus, the second sub-line patterns 222b may be electrically floated. Therefore, the second sub-line patterns 222b and the second doped regions 208 may correspond to dummy elements which are not used in the operation of the non-volatile memory device. In this case, the conductivity type of the first doped regions 208 may be the same as or different from that of the drain regions 206d. The third sub-line patterns 222c may also be electrically floated.

Contact holes filled with the lower contact plugs 219 and contact holes filled with the bit line plugs 218 may be formed simultaneously. In addition, the contact holes filled with the lower contact plugs 219 and contact holes filled with the lower source plug 220 may also be formed simultaneously. Alternatively, the contact holes filled with the lower contact plugs 219 and the contact holes filled with the lower source plug 220 may be formed using two different process steps. For example, the formation of the contact holes filled with the lower contact plugs 219 may be followed or preceded by the formation of the contact holes filled with the lower source plugs 220.

The lower contact plugs 219, the bit line plugs 218 and the lower source plug 220 may be formed of the same material layer. The dummy line patterns 228 and the bit lines 230 may be formed of the same material layer as the dummy line patterns 115 and the active line patterns 120 described with reference to FIGS. 2 and 3. Further, the lower contact plugs 219, the bit line plugs 218 and the lower source plug 220 may be formed of the same material layer as the lower contact plugs 106 described with reference to FIGS. 2 and 3. The upper source plug 234 and the interconnection 236 may be formed of the same material layer as the upper contact plug 125 and the interconnection 127 shown in FIGS. 2 and 3, respectively.

The second sub-line patterns 222b may be electrically floated. Alternatively, in some other embodiments, the second sub-line patterns 222b may be used to supply a well bias to the well including the first and second active regions, as illustrated in FIG. 12.

Figure 12:
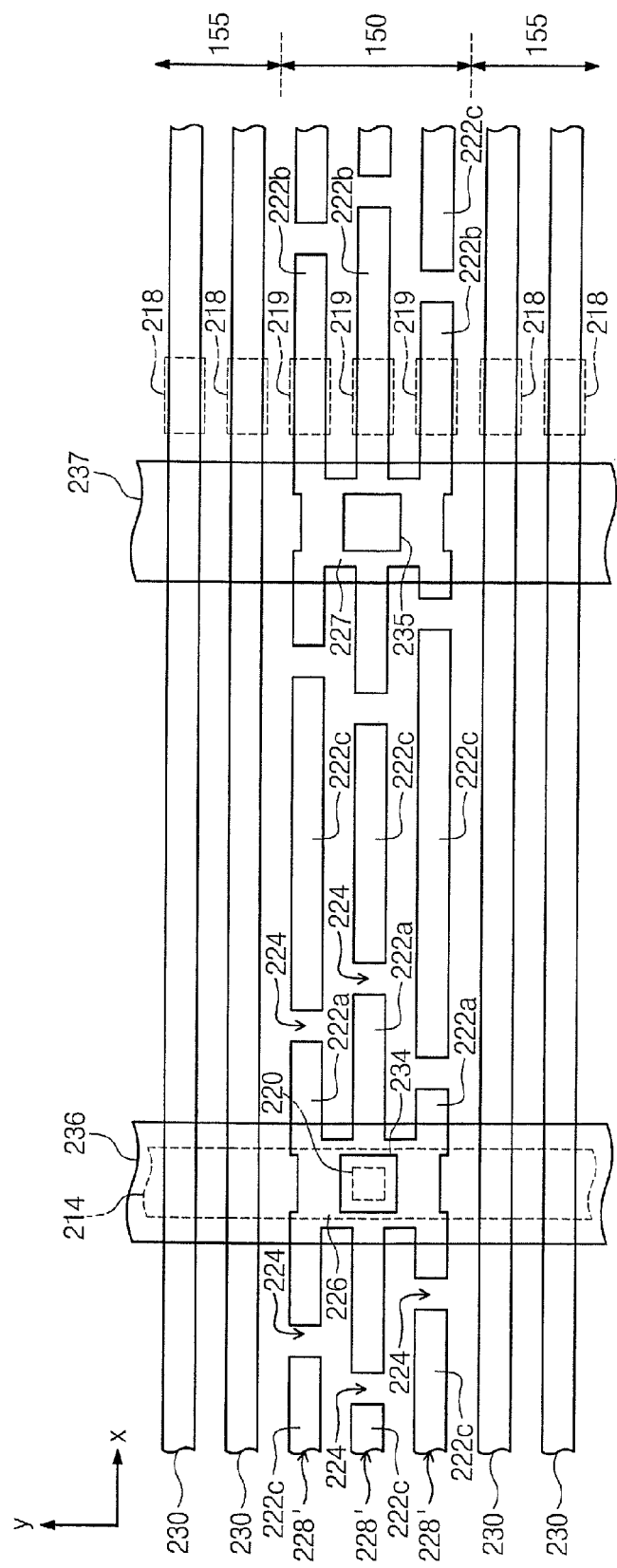
FIG. 12 is a plan view illustrating alternative embodiments of the semiconductor device shown in FIG. 8.

FIG. 12 is a plan view illustrating alternative embodiments of the semiconductor device shown in FIG. 8.

Referring to FIG. 12, some portions of the second sub-line patterns 222b extend along the second direction to contact each other. Accordingly, a landing pad 227 may be provided between the adjacent second sub-line patterns 222b. Both ends of the respective second sub-line patterns 222b may correspond to protrusions which extend from the landing pad 227 along the first direction. The landing pad 227 may be spaced apart from the lower contact plugs 219 when viewed from the plan view of FIG. 12. That is, the lower contact plugs 219 may be disposed to overlap with the protrusions of the second sub-line patterns 222b as illustrated in FIG. 12. In this case, the landing pad 227 may be located at one side of a second row on which the lower contact plugs 219 and the bit line plugs 218 are arrayed.

An upper contact plug 235 penetrates the third insulating layer 232 shown in FIG. 11, thereby contacting the landing pad 227. An interconnection 237 is disposed on the third insulating layer 232. The interconnection 237 may be electrically connected to the upper contact plug 235. A well bias may be applied to the interconnection 237. In this case, the second doped regions (208 of FIG. 11) may have the same conductivity type as the well including the first and second active regions. As a result, the well bias applied to the interconnection 237 may be supplied to the well through the upper contact plug 235, the landing pad 227, the protrusions of the second sub-line patterns 222b, the lower contact plugs 219 and the second doped regions (208 of FIG. 11). The second doped regions (208 of FIG. 11) may have a dopant concentration which is higher than that of the well.

In some other embodiments, the interconnection 237 may be electrically connected to the well using a different scheme from the aforementioned embodiments. For example, the structure illustrated in FIG. 3 may be applied to the semiconductor device of FIG. 12. In more detail, only one of the lower contact plugs 219 may be connected to one of the protrusions of the second sub-line patterns 222b including the landing pad 227. Further, the first active region connected to the single lower contact plug 219 may extend along the second direction to contact the adjacent first active regions. Thus, an active landing region is provided between the first active regions, and the single lower contact plug 219 may be formed on the active landing regions. In this case, the second doped region (208 of FIG. 11) may be provided in the active landing region.

Moreover, the second sub-line patterns 222b may be separated from each other without the landing pad 227. In this case, only one of the lower contact plugs 219 may be connected to one of the second sub-line patterns 222b, and the upper contact plug 235 may be located over the single lower contact plug 219. That is, the upper contact plug 235 may overlap with the single lower contact plug 219 when viewed from the plan view. The width of the single lower contact plug 219 along the second direction may be greater than that of the second sub-line pattern 222b, and the width of the upper contact plug 235 may be less than that of the single lower contact plug 219. Also, the width of the upper contact plug 235 may be greater than that of the second sub-line pattern 222b.

The upper contact plug 235 and the upper source plug 234 may be simultaneously formed using the same material layer. The interconnections 236 and 237 may also be formed using the same material layer simultaneously. As shown in FIG. 12, the interconnections 236 and 237 may be disposed to be parallel with the second direction. Alternatively, at least one of the interconnections 236 and 237 may extend along a different direction from the second direction.

Although not shown in the drawings, at least one of the third sub-line patterns 222c may be connected to a pick-up plug that passes through the third insulating layer 232 shown in FIG. 11. A pick-up interconnection may be disposed on the third insulating layer 232 to contact the pick-up plug. A reference voltage may be supplied to the at least one of the third sub-line patterns 222c through the pick-up interconnection and the pick-up plug. In the event that the reference voltage is applied to the third sub-line patterns 222c, the coupling effect between the first sub-line patterns 222a and the second sub-line patterns 222b can be minimized to improve the performance of the non-volatile memory device.

In yet some other embodiments, some portions of the third sub-line patterns 222c may also extend along the second direction to provide a landing pad between the third sub-line patterns 222c. In this case, the pick-up plug may be connected to the landing pad of the third sub-line patterns 222c.

Some of the aforementioned embodiments may be included within a non-volatile memory device such as a flash memory device. However, the present invention is not limited to use in non-volatile memory device. For example, some embodiments may be used in semiconductor devices other than the non-volatile memory devices, such as being employed more generally in electronic systems.

Figure 13:
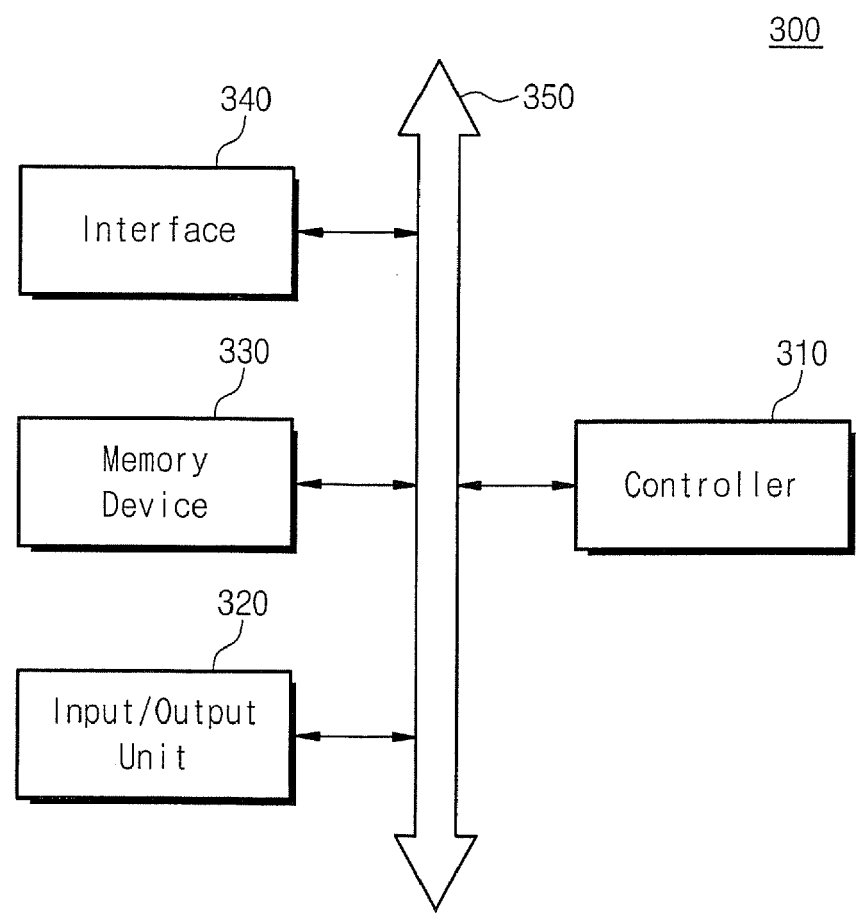
FIG. 13 is a block diagram illustrating an electronic system configured in accordance with some embodiments of the present invention.

FIG. 13 is a block diagram illustrating an electronic system including a semiconductor device configured in accordance with some embodiments of the present invention.

Referring to FIG. 13, the electronic system 300 may include a controller 310, an input/out (I/O) unit 320 and a memory device 330. The controller 310, the I/O unit 320 and the memory device 330 may communicate with each other through a bus 350. The bus 350 is a path through which the data and/or the electrical signals are conducted. The controller 310 may include at least one of a microprocessor, a digital signal processor, a microcontroller and a logic device having a similar function thereto. The controller 310 may include at least one of the semiconductor devices described with reference to FIGS. 2 to 7. The I/O unit 320 may include at least one of a key pad, a key board and a display unit. The memory device 330 may have a function for storing data. The memory device 330 may also store commands for execution of the controller 310. The memory device 330 may include a non-volatile memory device and/or a volatile memory device. The memory device 330 may include at least one of the semiconductor devices described with reference to FIGS. 2 to 12. The electronic system 300 may further include an interface 340 for transmitting data to a communication network or for receiving output data from the communication network. The interface 340 may be a wireless interface or a wired interface. For example, the interface 340 may include an antenna, a wireless transceiver or a transceiver having wires configured in accordance with at least one embodiment herein.

The electronic system 300 may be configured as a mobile system, a personal computer, an industrial computer, or another electronic system. The mobile system may include a personal digital assistant (PDA), a portable computer, a web tablet, a mobile phone, a wireless phone, a laptop computer, a memory card, a digital music system, and/or a data transceiver. When the electronic system 300 is configured with wireless communication functionality, such as within circuitry providing wireless communication functionality (e.g., third-generation wireless communication rationality).

Figure 14:
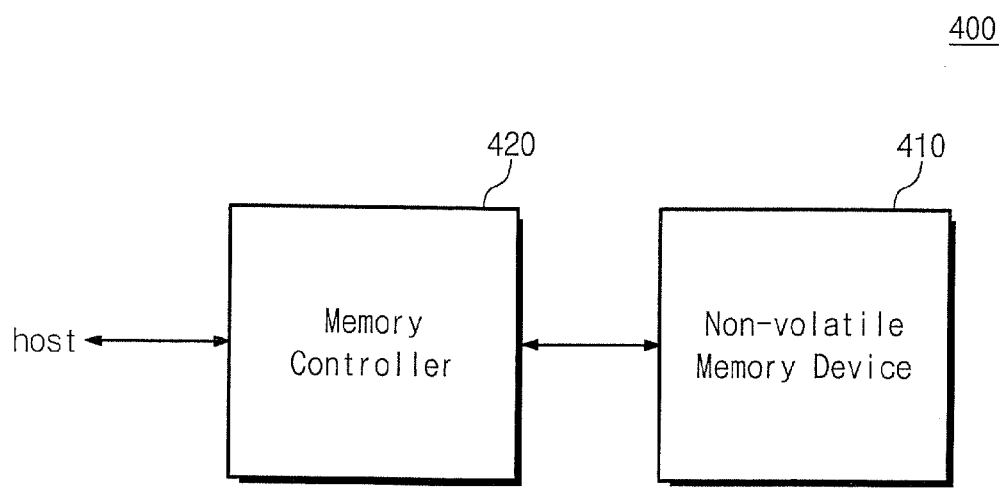
FIG. 14 is a block diagram illustrating a memory card configured in accordance with some embodiments of the present invention.

FIG. 14 is a block diagram illustrating a memory card including a semiconductor device configured in accordance with at least some embodiments of the present invention.

Referring to FIG. 14, the memory card 400 may include a non-volatile memory device 410 and a memory controller 420. The non-volatile memory device 410 may store data or read out the data stored therein. The non-volatile memory device 410 may include at least one of the semiconductor devices described with reference to FIGS. 2 to 12. For example, the non-volatile memory device 410 may include at least one of the MRAM device, the phase change memory device and the non-volatile memory device with the charge storing layer, which are disclosed in the first and/or second sets of embodiments. The memory controller 420 may control the non-volatile memory device 410 to store data into the non-volatile memory device 410 or to read out the data stored therein. The memory controller 420 may control the non-volatile memory device 410 in response to read/write signals of a host.

According to the semiconductor devices described above, at least one of cutting regions between sub-line patterns of a first dummy line pattern may overlap with (be bounded by) one of sub-line patterns of an adjacent second dummy line pattern. Thus, when a photolithography process is performed to form photoresist patterns for defining the sub-line patterns, light irradiated onto the cutting regions may result in substantially less interference phenomenon and, thereby, may avoid deformation of the sub-line patterns.

While the present invention has been particularly shown and described with respect to exemplary embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims and equivalents thereof.

What is claimed is:

1. A semiconductor device comprising:
   a substrate;
   a plurality of dummy line patterns on the substrate that extend in a first direction parallel with one another, each of the dummy line patterns including a plurality of sub-line patterns aligned along the first direction and which are separated from each other by at least one cutting region therebetween,
   wherein the dummy line patterns include first and second dummy line patterns which are adjacent to each other in a second direction that is perpendicular to the first direction, and wherein one of the cutting regions between a pair of sub-line patterns of the first dummy line pattern is aligned with and bounded by one of the sub-line patterns of the second dummy line pattern in the second direction; and
   a contact plug connected to at least one of the sub-line patterns, wherein a width of the contact plug along the second direction is greater than a width of the sub-line pattern connected to the contact plug.

2. The semiconductor device as set forth in claim 1, further comprising at least one active line pattern that is adjacent in the second direction and parallel to the first dummy line pattern and one of the cutting regions between a pair of sub-line patterns of the first dummy line pattern is aligned with and bounded by the active line pattern.

3. The semiconductor device as set forth in claim 2, wherein the at least one active line pattern is a bit line which is electrically connected to a memory cell.

4. The semiconductor device as set forth in claim 2, wherein the at least one active line pattern and the dummy line patterns are sequentially spaced apart a same distance in the second direction.

5. The semiconductor device as set forth in claim 1, wherein at least one of the sub-line patterns and at least two of the cutting regions are aligned in the second direction so that an imaginary straight line in the second direction extends therethrough.

6. The semiconductor device as set forth in claim 5, wherein the at least two cutting regions through which the imaginary straight line passes are adjacent to each other in the second direction.

7. The semiconductor device as set forth in claim 5, wherein at least one of the sub-line patterns is between and aligned in the second direction with the at least two cutting regions through which the imaginary straight line passes.

8. The semiconductor device as set forth in claim 1, wherein one of the cutting regions and at least one of the sub-line patterns are aligned in the second direction so that an imaginary straight line in the second direction extends therethrough.

9. The semiconductor device as set forth in claim 1, wherein the contact plug is between the sub-line pattern connected to the contact plug and the substrate.

10. The semiconductor device as set forth in claim 9, further comprising an upper contact plug on the sub-line pattern which is connected to the contact plug,
    wherein a width of the upper contact plug along the second direction is less than the width of the contact plug.

11. The semiconductor device as set forth in claim 1, wherein a portion of the sub-line pattern connected to the contact plug extends along the second direction to contact at least one of the other sub-line patterns adjacent thereto and to form a landing pad, and wherein the contact plug is connected to the landing pad.

12. The semiconductor device as set forth in claim 11, wherein the contact plug is between the landing pad and the substrate.

13. The semiconductor device as set forth in claim 11, wherein the contact plug is on the landing pad.

14. A semiconductor device comprising:
    a substrate;
    a plurality of dummy line patterns on the substrate that extend in a first direction parallel with one another, each of the dummy line patterns including a plurality of sub-line patterns aligned along the first direction and which are separated from each other by at least one cutting region therebetween,
    wherein the dummy line patterns include first and second dummy line patterns which are adjacent to each other in a second direction that is perpendicular to the first direction, and wherein one of the cutting regions between a pair of sub-line patterns of the first dummy line pattern is aligned with and bounded by one of the sub-line patterns of the second dummy line pattern in the second direction;
    a ground selection line, a plurality of word lines and a string selection line on the substrate extending in the second direction, the substrate having a first region and a second region;
    a first insulating layer on the substrate including the ground selection line, the word lines, and the string selection line;
    a common source line in the first insulating layer, the common source line contacting the substrate on one side of the ground selection line and extending along the second direction;
    a second insulating layer on the substrate including the common source line and the first insulating layer;

a plurality of bit lines on the second insulating layer and extending along the first direction; and a plurality of bit line plugs, each extending through the first and second insulating layers to electrically connect a respective one of the bit lines and the substrate on one side of the string selection line, wherein the plurality of dummy line patterns are on the second insulating layer in the first region.

15. The semiconductor device as set forth in claim 14, wherein the first and second regions are adjacent to each other, and wherein the bit lines and the dummy line patterns are sequentially spaced apart a same distance in the second direction.

16. The semiconductor device as set forth in claim 14, wherein each of the dummy line patterns comprises a first sub-line pattern crossing over the common source line and a second sub-line pattern crossing over the substrate at one side of the ground selection line.

17. The semiconductor device as set forth in claim 16, further comprising a lower source plug extending through the second insulating layer to electrically connect at least one of the first sub-line patterns to the common source line.

18. The semiconductor device as set forth in claim 17, wherein the lower source plug is connected to the first sub-line pattern thereon, wherein a width of the lower source plug along the second direction is greater than a width of the first sub-line pattern on the lower source plug.

19. The semiconductor device as set forth in claim 18, further comprising:

a third insulating layer on the second insulating layer, the bit lines, and the dummy line patterns; and an upper source plug extending through the third insulating layer to contact the first sub-line pattern which is connected to the lower source plug, wherein a width of the upper source plug along the second direction is less than the width of the lower source plug.

20. The semiconductor device as set forth in claim 17, wherein a portion of the first sub-line pattern connected to the lower source plug extends in the second direction to contact at least one of the other first sub-line patterns adjacent thereto and to form a landing pad, and wherein the lower source plug contacts a bottom surface of the landing pad.

21. The semiconductor device as set forth in claim 16, further comprising at least one lower contact plug, wherein the lower contact plug and the bit line plugs are arranged in a single row, and wherein the lower contact plug is electrically connected to at least one of the second sub-line patterns.

22. The semiconductor device as set forth in claim 21, further comprising:

a third insulating layer on the second insulating layer, the bit lines, and the dummy line patterns;

an upper contact plug extending through the third insulating layer to electrically connect to the second sub-line pattern which is connected to the lower contact plug; and a well pick-up region disposed in the substrate and which contacts the lower contact plug.

23. The semiconductor device as set forth in claim 16, further comprising third sub-line patterns between the first sub-line patterns and the second sub-line patterns.

* * * * *